United States Patent
Sohn

(10) Patent No.: US 8,796,606 B2
(45) Date of Patent: Aug. 5, 2014

(54) IMAGE SENSING DEVICE FOR FAST SIGNAL PROCESSING

(75) Inventor: Young Chul Sohn, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 339 days.

(21) Appl. No.: 13/296,446

(22) Filed: Nov. 15, 2011

(65) Prior Publication Data

US 2012/0119067 A1   May 17, 2012

(30) Foreign Application Priority Data

Nov. 17, 2010   (KR) .................. 10-2010-0114709

(51) Int. Cl.
*H01L 27/146*   (2006.01)

(52) U.S. Cl.
USPC ............ 250/208.1; 250/214 R; 348/303; 348/312; 348/E5.091

(58) Field of Classification Search
USPC ............ 250/208.1, 214 R, 214 DC, 214 SW; 348/294, 302, 303, 308, 312, 322, 348/E5.091, E5.092
See application file for complete search history.

(56) References Cited

U.S. PATENT DOCUMENTS

2010/0060765 A1*   3/2010   Kim et al. .................... 348/308
2012/0268636 A1*   10/2012   Mabuchi ...................... 348/302

FOREIGN PATENT DOCUMENTS

KR   1020050025084 A   3/2005
KR   1020100030438 A   3/2010

* cited by examiner

*Primary Examiner* — Kevin Pyo
(74) *Attorney, Agent, or Firm* — William Park & Associates Patent Ltd.

(57) ABSTRACT

An image sensing device includes a first circuit unit configured to convert an image signal provided from a first pixel into a digital value and generate first image data, a second circuit unit configured to convert an image signal provided from a second pixel into a digital value and generate second image data, and a processing unit configured to receive the first image data and the second image data at a substantially same time and sequentially output the first image data and the second image data according to a predetermined speed.

14 Claims, 5 Drawing Sheets

US 8,796,606 B2

IMAGE SENSING DEVICE FOR FAST SIGNAL PROCESSING

CROSS-REFERENCE(S) TO RELATED APPLICATIONS

The present application claims priority of Korean Patent Application No. 10-2010-0114709, filed on Nov. 17, 2010, which is incorporated herein by reference in its entirety.

BACKGROUND OF THE INVENTION

Exemplary embodiments of the present invention relate to an image sensing device, and more particularly, to a circuit for handling an image signal provided from a pixel.

An image sensing device such as a portable camera or a digital camera typically generates an image from a subject of the world. Examples of a sensing element in an image sensing device include a CMOS image sensor and a charge coupled device (CCD) image sensor. A CMOS image sensor or CCD image sensor has an array of pixels that respond to light for capturing images.

Various subjects in the natural world may have varying brightness and wavelengths of light. Each pixel of an image sensor corresponds to an electrical value depending on light from that subject. The electrical value is converted into an electrical voltage that can be processed in the image sensor. An image sensor includes an analog-to-digital (A/D) converter which converts analog voltages sensed by a pixel array into digital values and a memory for storing values during signal processing.

The pixel array is typically implemented as a matrix. Each pixel is arranged at the predetermined point of the matrix. Traditionally, a pixel includes four MOS transistors and a photodiode. The photodiode accumulates charges corresponding to incident light from the external. Three of the four MOS transistors serve as a switching element in the pixel and the other transistor serve as a source follower.

A required operating speed of an image sensing device has continuously increased. Hence, there are some limitations to increasing a signal processing speed of an image sensing device.

SUMMARY OF THE INVENTION

An embodiment of the present invention is directed to an image sensing device having a remarkably improved processing speed. In accordance with an embodiment of the present invention, an image sensing device includes a first circuit unit configured to convert an image signal provided from a first pixel into a first image data as a first digital value, a second circuit unit configured to convert an image signal provided from a second pixel into a second image data as a second digital value, and a processing unit configured to receive the first image data and the second image data substantially at the same time and sequentially output the first image data and the second image data according to a predetermined speed.

In accordance with another embodiment of the present invention, an image sensing device includes, a first circuit unit configured to convert an image signal provided from a first pixel into a digital value and generate first image data, a second circuit unit configured to convert an image signal provided from a second pixel into a digital value and generate second image data, a data reception unit configured to receive the first image data and the second image data at a substantially same time in correspondence to a first clock signal, and a data output unit configured to sequentially output the first image data and the second image data received from the data reception unit in correspondence to a second clock signal according to a predetermined speed.

In accordance with yet another embodiment of the present invention, an image sensing device includes a first comparator configured to compare a ramp signal with a first pixel signal provided from a first pixel, a second comparator configured to compare the ramp signal with a second pixel signal provided from a second pixel, a first counter configured to perform a counting operation according to the comparison result of the first comparator and generate a first digital value corresponding to the first pixel signal, a second counter configured to perform a counting operation according to the comparison result of the second comparator and generate a second digital value corresponding to the second pixel signal, and a processing unit configured to receive the first digital value from the first counter and the second digital value from the second counter at a substantially same time and sequentially output the first digital value and the second digital value according to a predetermined speed.

DESCRIPTION OF SPECIFIC EMBODIMENTS

Figure 1:
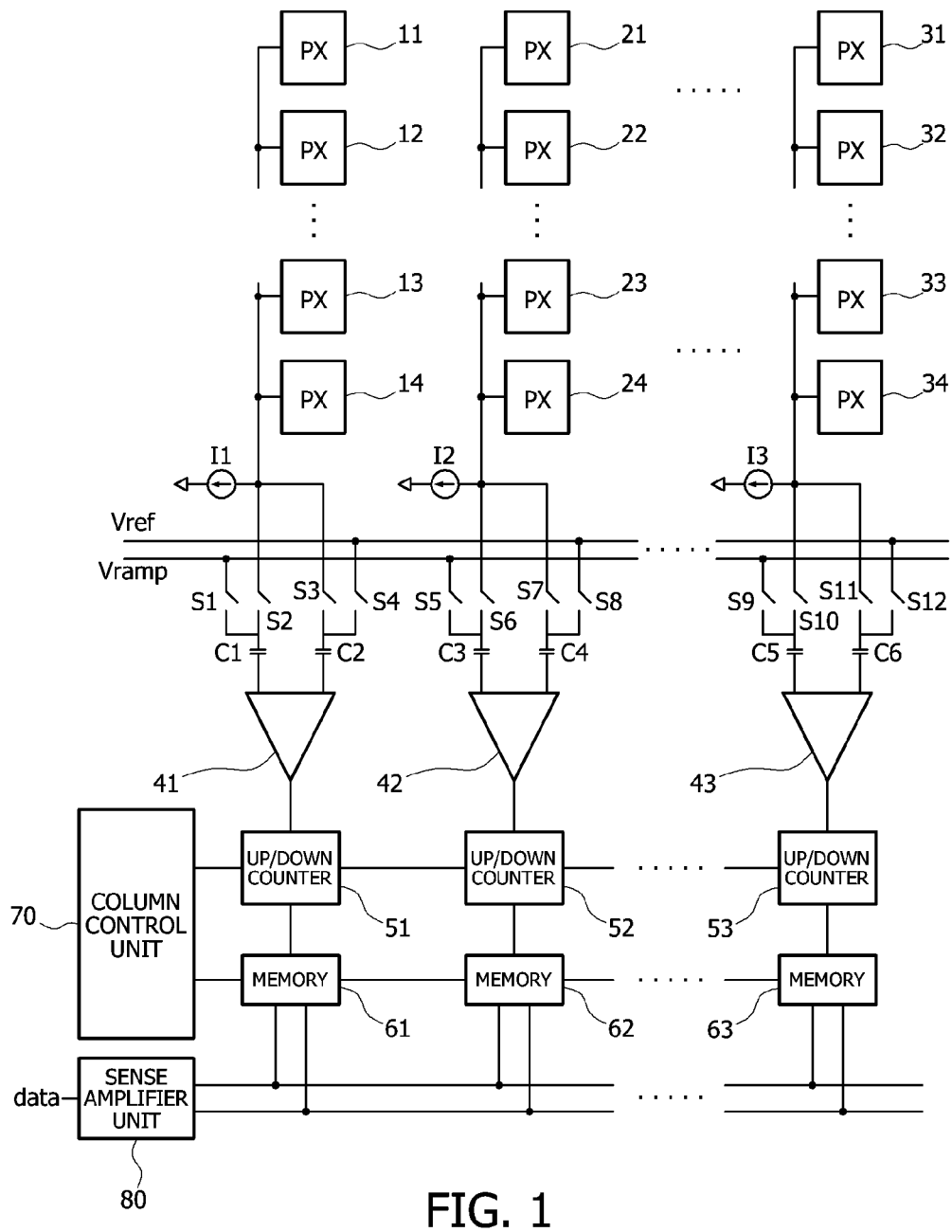
FIG. 1 is an exemplified block diagram of an image sensing device used for explanation of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram of an image sensing device, which is presented for explaining the present invention.

As illustrated in FIG. 1, an image sensing device includes a plurality of pixels 11 to 14, 21 to 24, and 31 to 34, constant current sources I1, 12, and 13, capacitors C1 to C6, comparators 41 to 43, switches S1 to S12, up/down counters 51 to 53, memory units 61 to 63, a column control unit 70, and a sense amplifier unit 80.

Since circuits corresponding to the comparators 41 to 43 are symmetrically arranged, the operation of the comparator 41 will be representatively described below. A diode provided within a pixel (e.g., a pixel 14) accumulates charges corresponding to external incident light, and the pixel 14 outputs an image signal corresponding to the accumulated charges and a reset signal having reset information.

When the switch S3 is turned on, charges corresponding to the reset signal provided from the pixel 14 are stored in the capacitor C2. Then, when the switch S2 is turned on, the image signal provided from the pixel 14 is stored in the capacitor C1. When the switch S4 is turned on, a reference signal Vref is applied to a first terminal of the capacitor C2. When the switch S1 is turned on, a ramp signal Vramp is applied to a first terminal of the capacitor C1. The reference signal Vref is a signal which maintains a constant value, and the ramp signal Vramp is a signal whose voltage level decreases at a constant rate. Therefore, charges corresponding to the reset signal and charges corresponding to the reference signal Vref are applied to a first terminal of the comparator 41, and charges corresponding to the image signal and charges corresponding to the ramp signal Vramp are applied to a second terminal of the comparator 41.

Since the ramp signal Vramp decreases over time, the signals at the two input terminals of the comparator 41 coincide with each other at a certain time point. After the time point, the output value of the comparator 41 is reversed. The up/down counter 51 counts from the time point at which the ramp signal Vramp starts to decrease to the time point when the output of the comparator 41 is reversed. The memory unit 61 stores and outputs the count value of the up/down counter 51.

The comparators 41, 42, and 43 perform the above-described comparison operation, and the up/down counters 51, 52, and 53 count values corresponding to the time point counted by the corresponding comparators. The memory units 61, 62 and 63 store the count values of the corresponding up/down counters 51, 52 and 53. The column control unit 70 controls the operations of the comparators 41, 42 and 43 and the memory units 61, 62 and 63.

The sense amplifier unit 80 amplifies signals corresponding to data values stored in and outputted from the memory units 61, 62, and 63. The sense amplifier unit 80 amplifies the output signal of the memory unit 61 and transfers the amplified signal to a next stage. The sense amplifier unit 80 amplifies the output signal of the memory unit 62 and transfers the amplified signal to a next stage. The sense amplifier unit 80 amplifies the output signal of the memory unit 63 and transfers the amplified signal to a next stage. The output signals of the memory units 61, 62, and 63 are amplified to facilitate transfer of the signals to the next stage because output impedance values calculated at the output terminals of the memory units 61, 62 and 63 are high. Therefore, in order to transfer data more exactly, the memory units 61, 62, and 63 output differential signals, and the sense amplifier unit 80 amplifies the differential signals.

As described above, the image sensing device compares the reset signal outputted from the pixel with the image signal through the comparator, counts the value corresponding to the comparison result, and stores the count value. The stored count value is transferred through the sense amplifier unit 80 to an image output circuit. In particular, the memory units 61, 62, and 63 output the differential signals in order to transfer signals to a next stage at a high speed.

The number of pixels provided in the image sensing device has recently been increased, and higher speed operation has been required. Therefore, a signal output speed of the memory units 61, 62, and 63 also should be increased. However, as the number of pixels is increased, output impedance values calculated at the output terminals of the memory units 61, 62, and 63 become higher. Thus, it is difficult to reliably transfer data from the memory units 61, 62, and 63 to a next stage.

To solve these problems, the present invention proposes an image sensing device including a circuit which can process the output data of each memory unit in parallel. That is, the image sensing device further includes a circuit which allows each memory unit to output data in parallel, converts the output data of each memory unit into serial data, and transfers the serial data to a next stage.

Figure 2:
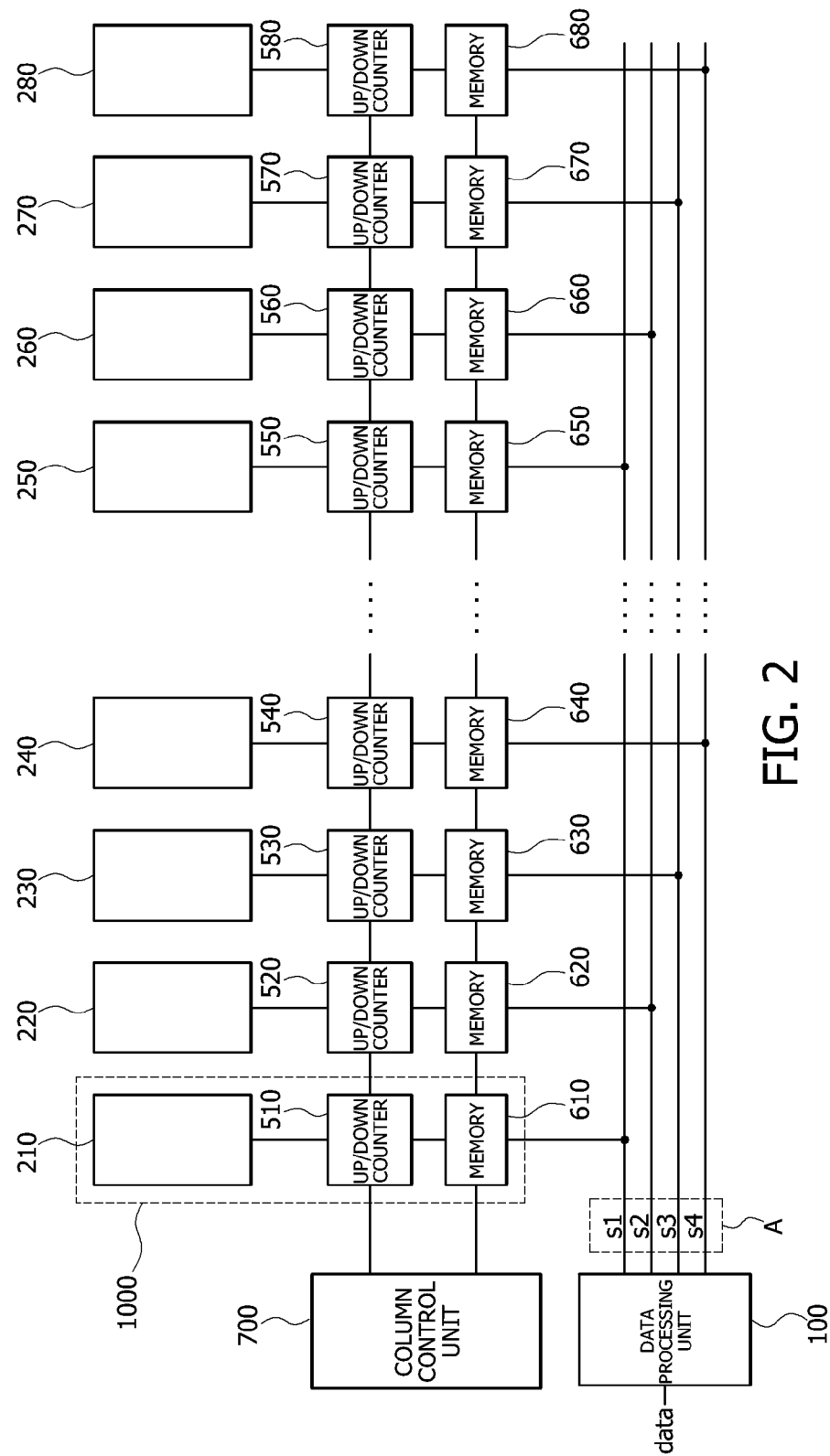
FIG. 2 is an exemplified block diagram of an image sensing device in accordance with a first embodiment of the present invention.

FIG. 2 is a block diagram of an image sensing device in accordance with a first embodiment of the present invention.

As illustrated in FIG. 2, the image sensing device in accordance with the first embodiment of the present invention includes a first circuit unit 1000 of a plurality of similar circuit units, a column control unit 700, and a data processing unit 100.

The first circuit unit 1000 includes a comparison circuit unit 210, a counter 510, and a memory unit 610. The comparison circuit unit 210 compares an image signal with a reset signal provided from a first pixel (not shown, see FIG. 1). The counter 510 performs a counting operation corresponding to the comparison operation of the comparison circuit unit 210. The memory unit 610 stores the count value of the counter 510. The first pixel is a pixel which is selected from a plurality of pixels arranged in a single column among a plurality of pixels provided in the image sensing device. The image sensing device includes as many comparison circuit units, counters and memory units as the number of columns formed by the plurality of pixels provided therein. The column control unit 700 controls the plurality of counters 510 to 580 and the memory units 610 to 680.

Consequently, the first circuit unit 1000 generates first image data S1 corresponding to an image signal provided from the first pixel selected among the plurality of pixels arranged in the first column. Similarly, the second circuit unit including a comparison circuit unit 220, a counter 520, and a memory unit 620 generates second image data S2 corresponding to an image signal provided from the second pixel selected among the plurality of pixels arranged in the second column. In this manner, third and fourth image data S3 and S4 are generated.

The data processing unit 100 receives the first image data S1 from the first circuit unit and the second image data S2 from the second circuit unit at a substantially same time, and sequentially outputs the received data at a predetermined speed. The data processing unit 100 receives the output signals of the memory units in parallel, and sequentially outputs the received signals according to a preset operation timing. Therefore, the output impedance applied to the output terminal of the single memory unit 610 is greatly reduced, as compared to the memory unit 61 illustrated in FIG. 1. Thus, as opposed to the case of FIG. 1, even though the memory units 610 to 680 of the image sensing device in accordance with the embodiment of the present invention outputs a single signal through a single line, instead of outputting differential signals, data can be transferred at a high speed. In other words, data can be transferred at a higher speed, and a differential signal can also be used in order to receive the data more easily.

For the sake of convenience, it is illustrated in FIG. 2 that the single memory unit 610 transfers the image data through the single line to the data processing unit 100. However, when the actual image sensing device is implemented, the image sensing device requires as many lines as the bit number of the image data generated in correspondence to the signals provided from the pixels. For example, when the memory unit 610 outputs 10-bit image data in correspondence to the image signal provided from the pixel at a time, ten lines are disposed from the memory unit 610 to the data processing unit 100.

Figure 3:
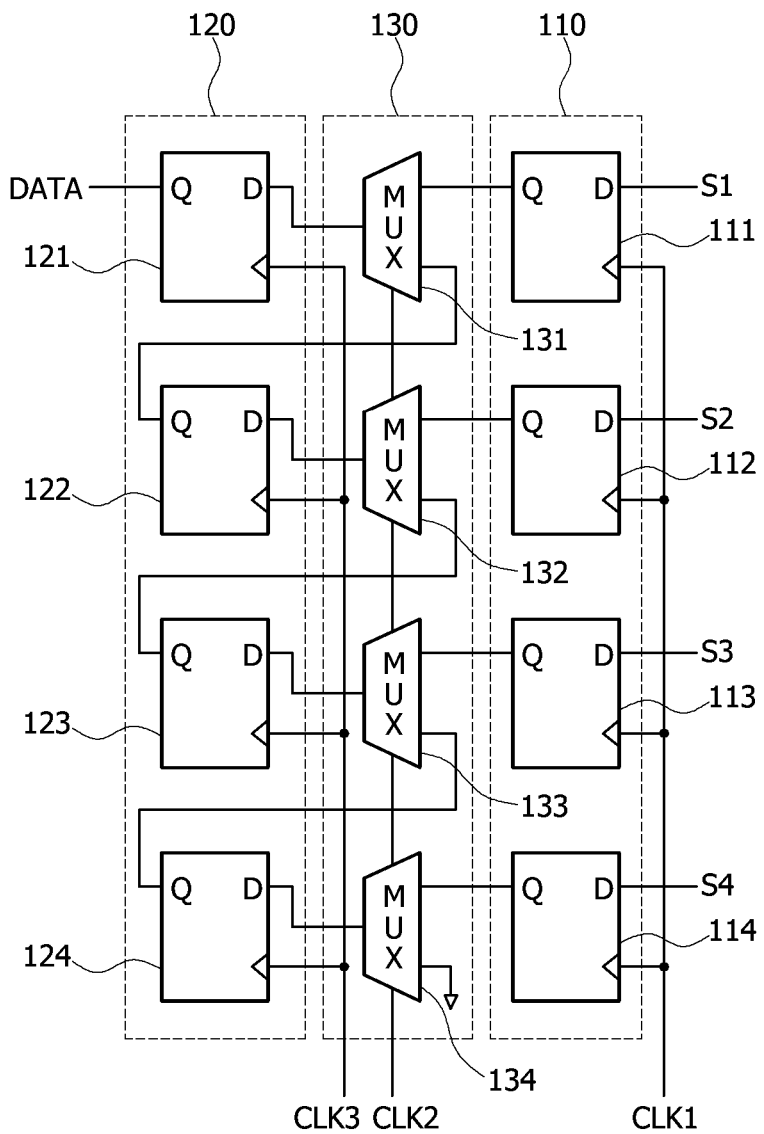
FIG. 3 is an exemplified circuit diagram of a data processing unit illustrated in FIG. 2.

FIG. 3 is a circuit diagram of the data processing unit illustrated in FIG. 2.

As illustrated in FIG. 3, the data processing unit 100 includes a data reception unit 110, a transfer unit 130, and a data output unit 120. The data reception unit 110 receives the first to fourth image data S1 to S4 from the memory units 610 to 640 at a transition timing of a first clock signal CLK1. The transfer unit 130 transfers the first to fourth image data S1 to S4, which are received from the data reception unit 110, at a transition timing of a second clock signal CLK2. The data output unit 120 sequentially outputs the first to fourth image data S1 to S4, which are transferred from the transfer unit 130, at a transition timing of a third clock signal CLK3 corresponding to a predetermined speed.

More specifically, the data reception unit 110 includes four flip-flops 111 to 114 which receive four input signals in response to the first clock signal CLK1. The transfer unit 130 includes four multiplexing units 131 to 134 which output one of two input signals in response to the second clock signal CLK2. In addition, the data output unit 120 includes four flip-flops 121 to 124 which operate in response to the transition timing of the third clock signal CLK3. The first flip-flop 121 outputs data, and the remaining flip-flops 122 to 124 receive the output signals of the corresponding multiplexing units 132 to 134 and transfer the received signals to the multiplexing units corresponding to the adjacent flip-flops.

The data processing unit 100 illustrated in FIG. 3 processes the image data provided from the four memory units in parallel. In some cases, when image data are received in parallel from more memory units, more flip-flops and multiplexing units may be included in the image sensing device.

For reference, as described above, the image data provided from the single memory unit is composed of multi-bits. To process the multi-bit image data, the data processing unit is also provided with as many flip-flops and multiplexing units as the bit number of the image data. For the sake of convenience, the data processing unit which processes 1-bit image data is illustrated.

Figure 4:
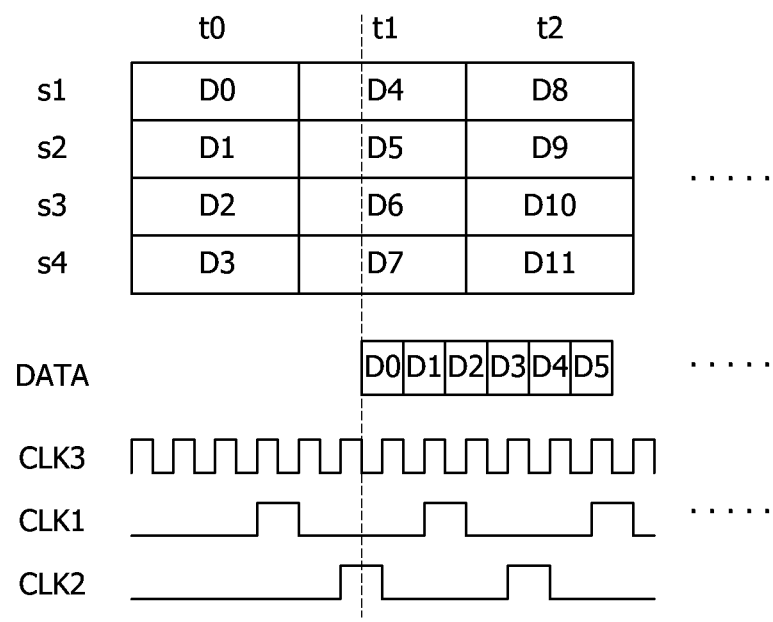
FIG. 4 is a waveform diagram explaining the operation of the data processing unit illustrated in FIG. 3.

FIG. 4 is a waveform diagram explaining the operation of the data processing unit illustrated in FIG. 3. The upper side of FIG. 4 illustrates the image data arranged in the data reception unit 110 at each timing t0, t1 and t2, and the lower side of FIG. 4 illustrates the waveforms of the first to third clock signals CLK1 to CLK3.

The interval between the transition timings of the first clock signal CLK1 and the interval between the transition timings of the second clock signal CLK2 are determined in correspondence to the time at which all the image data transferred to the data processing unit 100 are outputted by the data output unit 120. Since the data processing unit 100 receives four data in parallel, the data output unit 120 sequentially outputs the data during four cycles of the third clock signal CLK3. Therefore, the interval between the transition timings of the first clock signal CLK1 and the interval between the transition timings of the second clock signal CLK2 are determined to be four cycles of the third clock signal CLK3.

In addition, while the first to fourth image data received from the transfer unit 130 are outputted by the data output unit 120, the data reception unit 110 receives next first to fourth image data. Therefore, the image data D0 to D3 received by the data reception unit 110 are transferred to the data output unit 120 at the timing t0, and the data reception unit 110 receives next image data D4 to D7 at the timing t1 at which the data output unit 120 output the image data D0 to D4.

The first clock signal CLK1 is a signal which determines a time at which the signals from the plurality of memory units are transferred to the data reception unit 110. The second clock signal CLK2 is a signal which controls the multiplexing units 131 to 134 of the transfer unit 110 in order to transfer the data to the data output unit 120 when the data reception unit 110 receives the image data. The third clock signal CLK3 is a clock signal which has a frequency corresponding to an internal data processing speed of the image sensing device in accordance with the embodiment of the present invention. The flip-flop 121 sequentially outputs the image data according to the transition timing of the third clock signal CLK3. The image sensing device reproduces the final image by using the data sequentially outputted from the flip-flop 121.

As described above, when the data processing unit is provided in the image sensing device, the operating speed of each circuit (e.g., 1000 of FIG. 2) which generates the image data corresponding to the pixel can be remarkably reduced, as compared to the required operating speed of the image sensing device. For example, when the data output speed of the data processing unit 100 is 100 MHz, data outputted from the four memory units have only to be 25 MHz. Therefore, it is unnecessary to increase the operating speed of each circuit unit which is provided in the image sensing device to generate the image data. Hence, more reliable image data can be generated using the signals provided from the pixels.

Figure 5:
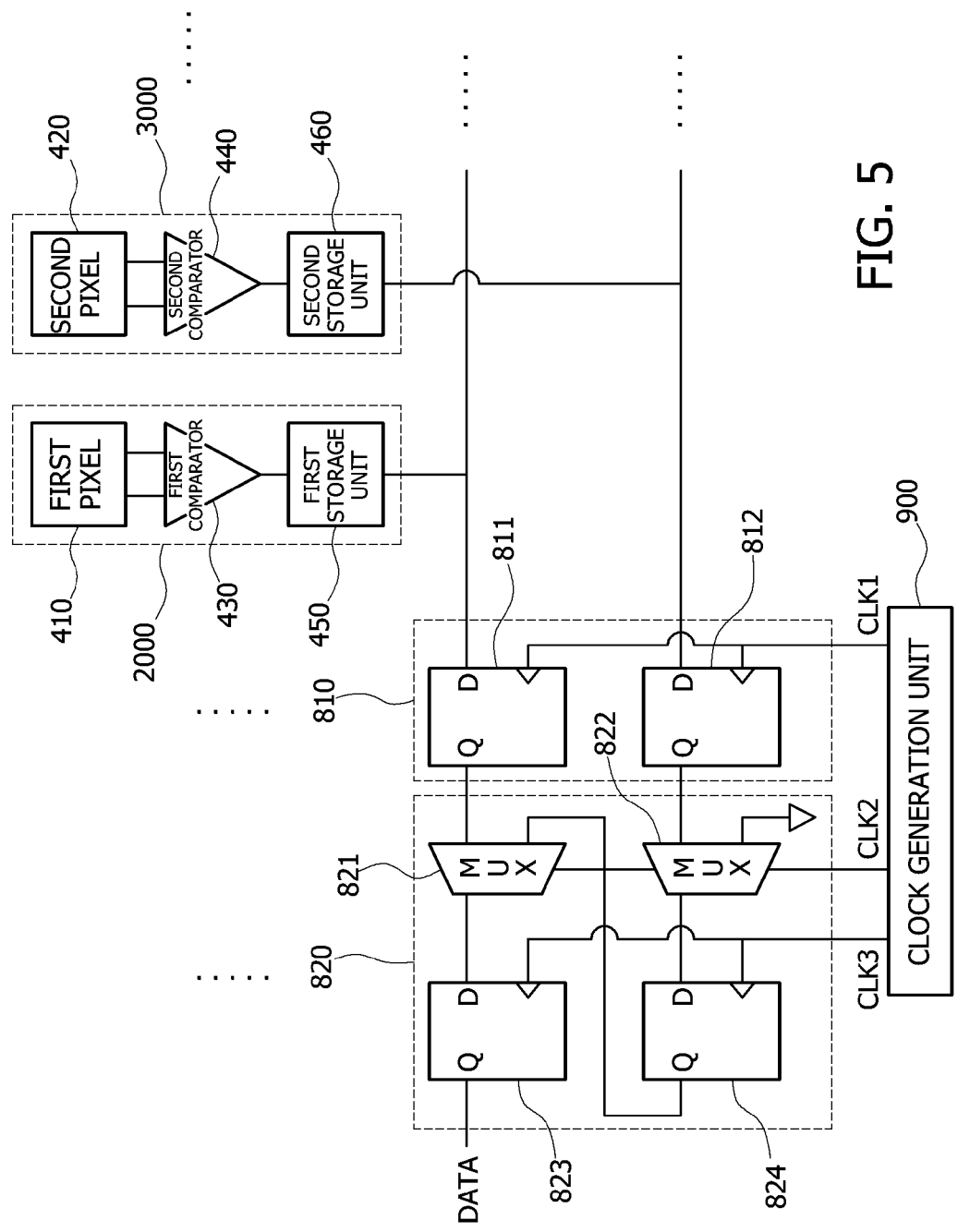
FIG. 5 is an exemplified block diagram of an image sensing device in accordance with a second embodiment of the present invention.

FIG. 5 is a block diagram of an image sensing device in accordance with a second embodiment of the present invention.

Referring to FIG. 5, the image sensing device in accordance with the embodiment of the present invention includes a first circuit unit 2000, a second circuit unit 3000, a data reception unit 810, a data output unit 820, and a clock generation unit 900. The first circuit unit 2000 generates first image data corresponding to an image signal provided from a first pixel. The second circuit unit 3000 generates second image data corresponding to an image signal provided from a second pixel selected among a plurality of pixels provided in a second column. The data reception unit 810 receives the first and second image data at a substantially same time in correspondence to the transition timing of the first clock signal CLK1. The data output unit 820 sequentially outputs the first and second image data received by the data reception unit 810, based on a predetermined speed. The clock generation unit 900 generates the first to third clock signals CLK1 to CLK3.

The data reception unit 810 includes a first flip-flop 811 and a second flip-flop 812. The first flip-flop 811 receives the first image data in response to the transition timing of the first clock signal CLK1, and the second flip-flop 812 receives the second image data in response to the transition timing of the first clock signal CLK1.

The data output unit 820 includes a first multiplexing unit 821, a second multiplexing unit 822, a third flip-flop 823, and a fourth flip-flop 824. The first multiplexing unit 821 receives the first image data stored in the first flip-flop 811 through a first terminal and transfers the first image data, or outputs a signal received through a second terminal, in response to the second clock signal CLK2. The second multiplexing unit 822 receives the second image data stored in the second flip-flop 812 through a first terminal and transfers the second image data, or outputs a signal received through a second terminal, in response to the second clock signal CLK2. The third flip-flop 823 outputs the signal transferred from the first multiplexing unit 821 in response to the transition timing of the third clock signal CLK3. The fourth flip-flop 824 outputs the signal transferred from the second multiplexing unit 822 to the second terminal of the first multiplexing unit 821 in response to the transition timing of the third clock signal CLK3.

The interval between the transition timings of the first clock signal CLK1 is determined in correspondence to the time at which the data output unit 120 outputs all the received data. In addition, while the first and second image data received from the data reception unit 810 are outputted by the data output unit 820, the data reception unit 810 receives next first and second image data.

The first circuit unit 2000 includes a first comparison circuit unit 430 and a first storage unit 430. The first comparison circuit unit 430 compares a reset signal and an image signal provided from a first pixel 410. The first storage unit 450 stores a value counted in correspondence to the comparison operation of the first comparison circuit unit 430. The second circuit unit 3000 includes a second comparison circuit unit 440 and a second storage unit 460. The second comparison circuit unit 440 compares a reset signal and an image signal provided from a first pixel 420. The second storage unit 460 stores a value counted in correspondence to the comparison operation of the second comparison circuit unit 440.

The first and second image values are digital values having a preset number of bits. That is, the image data outputted from the first storage unit 450 has multi-bits. However, for the sake of convenience, the multi-bit image data is represented by a single line.

In accordance with the exemplary embodiments of the present invention, the total signal processing speed of the image sensing device can be remarkably increased, while the processing time of the signal outputted from the pixel of the image sensing device is maintained at the same level as the conventional art.

While the present invention has been described with respect to the specific embodiments, it will be apparent to those skilled in the art that various changes and modifications may be made without departing from the spirit and scope of the invention as defined in the following claims.

What is claimed is:

1. An image sensing device comprising:
   a first circuit unit configured to convert an image signal from a first pixel into a first image data as a first digital value;
   a second circuit unit configured to convert an image signal from a second pixel into a second image data as a second digital value; and
   a processing unit configured to receive the first image data and the second image data substantially at the same time and sequentially output the first image data and the second image data according to a predetermined speed,
   wherein the processing unit comprises:
   a first flip-flop configured to receive the first image data in response to the first clock signal;
   a second flip-flop configured to receive the second image data in response to the first clock signal;
   a first multiplexing unit configured to receive the first image data stored in the first flip-flop through a first terminal and transfer the first image data, or output a signal received through a second terminal, in response to the second clock signal;
   a second multiplexing unit configured to receive the second image data stored in the second flip-flop through a first terminal and transfer the second image data, or output a signal received through a second terminal, in response to the second clock signal;
   a third flip-flop configured to output the signal transferred from the first multiplexing unit in response to the third clock signal; and
   a fourth flip-flop configured to transfer the signal transferred from the second multiplexing unit to the second terminal of the first multiplexing unit in response to the third clock signal.

2. The image sensing device of claim 1, wherein the processing unit comprises:
   a data reception unit configured to receive the first image data and the second image data in response to a first clock signal;
   a transfer unit configured to transfer the first image data and the second image data received from the data reception unit, in response to a second clock signal; and
   a data output unit configured to sequentially output the first image data and the second image data received from the transfer unit in response to a third clock signal corresponding to the predetermined speed.

3. The image sensing device of claim 2, wherein a first clock signal period and a second clock signal period are determined in correspondence to time at which the data output unit outputs all the received data.

4. The image sensing device of claim 3, wherein, while the data output unit outputs the first image data and the second image data transferred from the transfer unit, the data reception unit receives a next first image data and a next second image data from the first circuit unit and the second circuit unit.

5. The image sensing device of claim 1, further comprising:
   a first data path configured to transfer the first image data from the first circuit unit to the processing unit; and
   a second data path configured to transfer the second image data from the second circuit unit to the processing unit.

6. The image sensing device of claim 1, wherein the first circuit unit comprises:
   a comparison circuit unit configured to compare a ramp signal and an image signal provided from the first pixel;
   a counter configured to perform a counting operation corresponding to the comparison operation of the comparison circuit unit; and
   a storage unit configured to store a count value of the counter.

7. The image sensing device of claim 1, wherein the first image data and the second image data are digital values having a preset number of bits.

8. An image sensing device comprising:
   a first circuit unit configured to convert an image signal from a first pixel into a digital value and generate first image data;
   a second circuit unit configured to convert an image signal from a second pixel into a digital value and generate second image data;
   a data reception unit configured to receive the first image data and the second image data at a substantially same time in correspondence to a first clock signal; and
   a data output unit configured to sequentially output the first image data and the second image data received from the data reception unit in correspondence to a second clock signal according to a predetermined speed,
   wherein the data reception unit comprises:
   a first flip-flop configured to receive the first image data in response to the first clock signal; and
   a second flip-flop configured to receive the second image data in response to the first clock signal, and
   wherein the data output unit comprises:
   a first multiplexing unit configured to receive the first image data stored in the first flip-flop through a first terminal and transfer the first image data, or output a signal received through a second terminal, in response to the third clock signal;
   a second multiplexing unit configured to receive the second image data stored in the second flip-flop through a first terminal and transfer the second image data, or output a signal received through a second terminal, in response to the third clock signal;

a third flip-flop configured to output the signal transferred from the first multiplexing unit in response to the second clock signal; and a fourth flip-flop configured to transfer the signal transferred from the second multiplexing unit to the second terminal of the first multiplexing unit in response to the second clock signal.

9. The image sensing device of claim 8, wherein a first clock signal period is determined in correspondence to time at which the data output unit outputs all the received data.

10. The image sensing device of claim 8, wherein, while the data output unit outputs the first image data and the second image data transferred from the data reception unit, the data reception unit receives next first image data and next second image data from the first circuit unit and the second circuit unit.

11. The image sensing device of claim 8, wherein the first circuit unit comprises:
  a comparison circuit unit configured to compare a ramp signal and an image signal provided from the first pixel;
  a counter configured to perform a counting operation corresponding to the comparison operation of the comparison circuit unit; and
  a storage unit configured to store a count value of the counter.

12. The image sensing device of claim 8, wherein the first image data and the second image data are digital values having a preset number of bits.

13. An image sensing device comprising:
  a first comparator configured to compare a ramp signal with a first pixel signal from a first pixel;
  a second comparator configured to compare the ramp signal with a second pixel signal from a second pixel;
  a first counter configured to perform a counting operation according to the comparison result of the first comparator and generate a first digital value corresponding to the first pixel signal;
  a second counter configured to perform a counting operation according to the comparison result of the second comparator and generate a second digital value corresponding to the second pixel signal; and
  a processing unit configured to receive the first digital value from the first counter and the second digital value from the second counter at a substantially same time and sequentially output the first digital value and the second digital value according to a predetermined speed, wherein the processing unit comprises:
a data reception unit configured to receive the first digital value and the second digital value in correspondence to a first clock signal;
a transfer unit configured to transfer the first digital value and the second digital value, which are received from the data reception unit, in correspondence to a second clock signal; and
a data output unit configured to sequentially output the first digital value and the second digital value, which are received from the transfer unit, in correspondence to a third clock signal corresponding to the predetermined speed, wherein the data output unit comprises:
a first multiplexing unit configured to receive a first image data stored in a first flip-flop through a first terminal and transfer the first image data, or output a signal received through a second terminal, in response to the third clock signal;
a second multiplexing unit configured to receive a second image data stored in a second flip-flop through a first terminal and transfer the second image data, or output a signal received through a second terminal, in response to the third clock signal;
a first flip-flop configured to output the signal transferred from the first multiplexing unit in response to the second clock signal; and
a second flip-flop configured to transfer the signal transferred from the second multiplexing unit to the second terminal of the first multiplexing unit in response to the second clock signal.

14. The image sensing device of claim 13, wherein a first clock signal period and a second clock signal period are determined in correspondence to time at which the data output unit outputs all the received digital values.

* * * * *